United States Patent [19]

Sartori et al.

[11] Patent Number: 5,095,231

[45] Date of Patent: Mar. 10, 1992

[54] AUTOMATIC SYSTEM FOR ADJUSTING THE OUTPUT IMPEDANCE OF FAST CMOS DRIVERS

[75] Inventors: Mario Sartori; Valter Bella, both of Turin; Franco Salerno, Alpignano, all of Italy

[73] Assignee: CSELT - Centro Studi e Laboratori Telecomunicazioni S.p.A., Turin, Italy

[21] Appl. No.: 549,900

[22] Filed: Jul. 9, 1990

[30] Foreign Application Priority Data

Jul. 26, 1989 [IT] Italy .................. 67631 A/89

[51] Int. Cl.$^5$ .................. H03K 19/092; H03K 3/01
[52] U.S. Cl. .................. 307/475; 307/270; 307/451
[58] Field of Search .............. 307/270, 475, 451, 557

[56] References Cited

U.S. PATENT DOCUMENTS

| | | | |
|---|---|---|---|
| 4,437,024 | 3/1984 | Wacyk | 307/475 |
| 4,620,310 | 10/1986 | Lvovsky et al. | 307/270 |
| 4,825,099 | 4/1989 | Barton | 307/270 |
| 4,853,560 | 8/1989 | Iwamura et al. | 307/475 |
| 4,897,564 | 1/1990 | Chen | 307/473 |
| 4,972,517 | 11/1990 | Kondou et al. | 307/475 |

OTHER PUBLICATIONS

A Self-Terminating Low-Voltage Swing CMOS Output Driver, vol. 23, No. 2 Thomas F. Knight et al, IEEE, Journal of Solid State Circuits, 4/1988.

Primary Examiner—Edward P. Westin
Assistant Examiner—Richard Roseen
Attorney, Agent, or Firm—Herbert Dubno

[57] ABSTRACT

An automatic system for adjusting the output impedance of fast CMOS drivers, wherein the output impedance of a plurality of slaved drives is adjusted by a circuit for measuring and correcting mismatch between the output impedance of one of the drivers, taken as reference and dedicated for this purpose, and the impedance at the input of a reference transmission line, equal to the lines connected to the other drivers. The measuring of the output impedance of the reference drive is indirectly effected by inserting at the reference drive input a clock signal and by periodically measuring the output on the reference transmission line in correspondence with the positive half-period center. The measured voltage is sent to a comparator whereby it is compared with a reference level equal to half the maximum level present in the line under matching conditions and, according to the comparison result, a signal is supplied capable of charging or discharging a capacitor, across whose terminals a voltage controlling the driver output impedance is available.

4 Claims, 1 Drawing Sheet

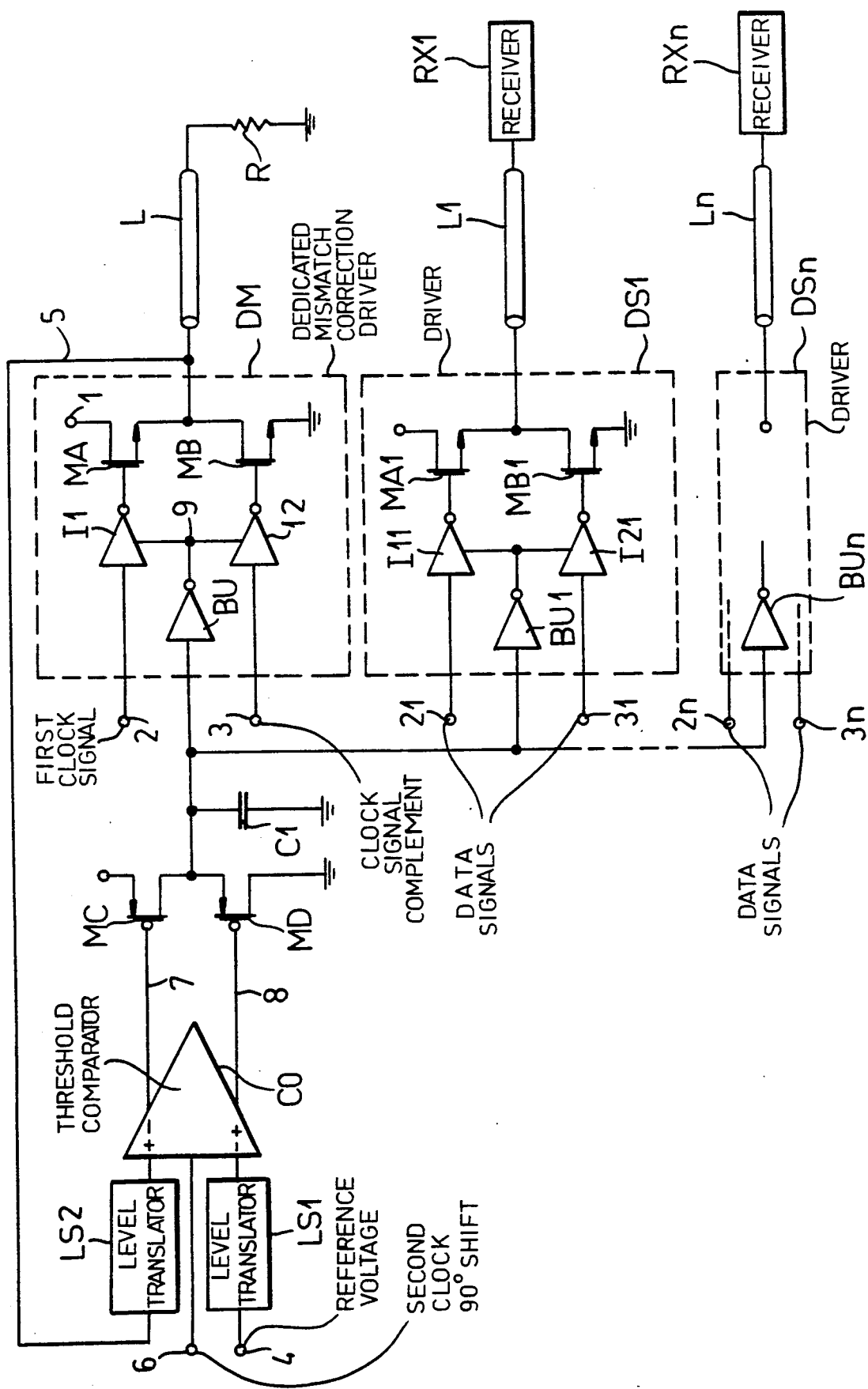

AUTOMATIC SYSTEM FOR ADJUSTING THE OUTPUT IMPEDANCE OF FAST CMOS DRIVERS

FIELD OF THE INVENTION

The present invention relates to digital electronic circuits and, more particularly, to an automatic system for adjusting the output impedance of fast CMOS drivers.

BACKGROUND OF THE INVENTION

It is known that when a driver is to send a digital flow to a remote receiver through a transmission line there can be problems in the case in which there is no good match between transmission line impedance and the input and output impedances of the circuits connected therewith. Generally, in these cases there are power losses and multiple reflections which can cause an error probability increase in the symbol reception since, at a certain instant, in addition to the symbol transmitted at the given instant, there are present at the receiver, symbols transmitted in preceding time intervals and reflected by the line ends.

These disadvantages can be eliminated if at least the driver output impedance is rendered equal to the characteristic impedance of the line. In fact, even though there may be a mismatch at the output connected to the receiver, the input impedance of a rather long line is almost equal to the characteristic line impedance. That would result in a reflection at the far end of the line, but the reflected signal is absorbed at the input by the driver output impedance, whose value is equal to the line impedance, thus avoiding multiple reflections.

Under these conditions the receiver receives only the direct signal, whose signal width is doubled as an effect of overlapping between the direct signal and the signal immediately reflected, of course under the hypothesis that the receiver input impedance exceeds characteristic line impedance.

However, drivers with output impedance equal to the the characteristic impedance of the usual transmission lines are not easy to build, owing to unavoidable tolerances in fabricating process. Besides, the same transmission lines can have tolerances in the characteristic impedance. It is hence advisable to have an automatic system for adjusting the driver output impedance so as to obtain a good matching to the line, independent of fabrication tolerances and accidental circuit variations.

It is also convenient that the driver output impedance be made equal to the characteristic line impedance without using an external additional resistance, in order to avoid an oversizing of the output circuit with consequent speed loss and power consumption.

A solution to these problems has been described in the article entitled "A Self-Terminating Low-Voltage Swing CMOS Output Driver" by Thomas F. Knight et al, IEEE Journal of Solid State Circuits, Vol. 23, No. 2, April 1988.

In this system, the output impedance of a plurality of drivers contained in the same integrated circuit is controlled by a suitable circuit, also housed in the integrated circuit, comprising a driver, analogous to those controlled, and a receiver. The control driver sends a clock signal, locally-generated for this control purpose, on a transmission line length with the same characteristics as those of the lines connected to controlled-driver outputs. The line output is connected to the receiver input, that extracts from the received signal an enabling signal synchronized to logic-level transitions.

The voltage at the input of the reference line is read continuously by a threshold comparator, whereby it is compared with a threshold voltage of value equal to half the maximum value of the output voltage of the driver under matching conditions.

The information at the output of the comparator is considered valid, and can be used for control purposes, only at the instant when the receiver has detected a transition on the line after a delay slightly exceeding reference line propagating time, permitting the line voltage to stabilize at a level independent on a reflection coefficient value at the transmission end.

It is clear that in case of impedance matching between the driving line and the reference line the voltage at the line input, upon transmission of an edge, is equal to half the maximum value of the output voltage at the transmission end. That is why in this case (i.e. the case of matching) the comparator does not supply any output signal. However, if there is no matching, the information relevant to the algebraic difference with respect to threshold is used to vary a pulsed voltage across the terminals of a high-value capacitor, which is placed outside the integrated circuit. Therefore, the amplitude of this voltage varies as a function of the reflection coefficient at the reference line input.

A CMOS driver output impedance can be controlled by varying the gate voltage of the two transistors of the output stage within certain limits determined by the geometrical dimensions of the transistors themselves. To obtain this control, the predriver stages have to be fed with a suitable voltage, which in case of the approach described in the cited article is the pulsed voltage present at the external-capacity terminals. This voltage, besides matching the reference driver output impedance to the reference line, matches also the output impedance of all the other slaved drivers, being utilized to feed also all the other predriver stages.

If line voltage exceeds threshold voltage at the comparator input, the capacitor is continuously discharged by a power circuit, while in the opposite case the capacitor is charged and supplies current to all the predriver stages at the transition, up to the obtaining of an optimal value corresponding to the impedance matching condition.

However this circuit has a number of disadvantages. A first disadvantage is that during the initial adjusting phase at both line ends there is impedance mismatch, and hence there is a multiple reflection condition. As a consequence when a reflected edge goes back to the emitter to alter the line voltage level in the time interval in which the information is taken as valid, an error can be generated which places the circuit in an ambiguous adjustment condition.

Another disadvantage is due to threshold comparator response time, which must be much lower that the delay introduced by the reference transmission line, since when the receiver has detected the level transition for generating the signal enabling the reading of line voltage, the comparator output must be at the steady-state value. This delay, dependent on line length, is usually very small (of the order of ns) since the line is short. In addition, if a low error is desired, the differential voltage at the comparator inputs must very low and that implies a very sophisticated comparator.

Finally this circuit needs a large capacitor, which is not integratable and hence must be placed outside the integrated circuit. Also the driving of this capacitor needs power circuits, with consequent speed loss.

OBJECT OF THE INVENTION

It is an object of the invention to provide an automatic system for adjusting the output impedance of fast CMOS drivers, which does not have a multiple reflection condition during the initial output impedance adjusting, does not require a high performance threshold comparator, does not require a large capacitor which is difficult to integrate, and avoids mutual interference among slaved drivers.

SUMMARY OF THE INVENTION

The present invention provides an automatic system for adjusting the output impedance of fast CMOS drivers, wherein the output impedance of a plurality of slaved drivers is controlled by a circuit for measuring and correcting mismatch between one of the drivers, taken as reference and dedicated for this purpose, and the impedance at the input of a reference transmission line, equal to lines connected to the other drivers. The output impedance adjustment of the reference driver is carried out by a comparator comparing the maximum voltage of a clock signal supplied by that reference driver at the input of the reference line with a reference voltage equal to half the supply voltage of the output stage of the drivers. Dependent on the result of the comparison, the comparator supplies a current which periodically charges or discharges a capacitor, so as to obtain across its terminals a control voltage for the driver impedance.

According to the invention a first clock signal is sent to the input of the reference driver producing a periodic signal on the reference line terminated by a resistance equal to its characteristic impedance and the periodic signal present at the reference line input is compared with the reference voltage in a threshold comparator in correspondence with the transitions of a second clock signal with a frequency equal to that of the first clock signal, but in quadrature so as to carry out the comparison at the center of the half-period wherein the voltage at the input of the reference line is maximum. The center of a half period of course represents the peak of a half cycle and is, in terms of a full cycle, one-fourth thereof; The comparison result is used to charge or discharge a capacitor, whose voltage is applied to the input of a plurality of buffer amplifiers, one of which controls the output impedance of the reference driver while the others control the output impedance of the slaved drivers.

BRIEF DESCRIPTION OF THE DRAWING

The foregoing and other characteristics of the present invention will become more readily apparent from the following description reference being made to the accompanying drawing, the sole FIGURE of which is an electrical circuit diagram of the system of the invention.

SPECIFIC DESCRIPTION

According to the invention, a circuit for the measurement and correction of mismatch between the output impedance of a dedicated driver DM, and the characteristic impedance of a transmission line L, equal to lines L1...Ln connected to the other drivers, terminated by a resistance R equal to its characteristic impedance, is added in an integrated circuit comprising a plurality of drivers DS1...DSn.

The output impedance of reference driver DM is measured by measuring the input voltage of line L, which under perfect matching conditions is equal to half the supply voltage of the output stage of the driver, consisting of transistors MA and MB. These transistors are fed with a well-determined and constant voltage, whose value is equal to 1 V, owing to high transmission rate demanded of such drivers, e.g. 160 Mbit/s. As a consequence, under perfect matching conditions, at the input of transmission line L the maximum signal amplitude is 0.5 V, while under mismatch conditions this value changes and the system operates so as to vary the output impedance of the reference driver DM till a maximum signal voltage of 0.5 V is reached again.

The reference driver receives at its inputs 2 and 3 a clock signal and its complementary signal, generated by a suitable generator not shown in the Figure. These signals have a frequency less than the bit rate of signals at inputs 21, 31 ... 2n, 3n of the other slaved drivers DS1 ... DSN. These clock signals also are of equal flank steepness or slope to the signals of the slave drivers in order to maintain the same behavior in presence of transitions. It is thus possible to ensure uniformity of the step response of reference line L with that of the other lines L1 ... Ln, connected to corresponding receivers RX1, ... RXn. More particularly, the clock signal frequency can be equal to about one fourth of the transmitted signal bit rate.

The circuit for measuring and correcting impedance mismatch consists of a threshold comparator CO, which compares 0.5 V reference voltage, applied to the terminal 4 of level translating circuit LS1, with the voltage measured at line L input and equally level translated by a translating circuit LS2, receiving it via wire 5. Said translating circuits LS1 and LS2 are rendered necessary to meet common-mode dynamic-range requirements of threshold comparator CO.

The comparison is carried out by threshold comparator CO under the control of a clock signal applied to input 6. This signal has the same characteristics as the signal applied to input 2 of the driver DM, but it leads this latter by a 90° phase so as to guarantee that the voltage reading at the the input of transmission line L takes always place in correspondence with the high voltage level.

The automatic system for impedance matching operates as follows. When the clock signal at input 6 is at low level, the signals at both outputs connected to wires 7 and 8 are at high level and hence P-MOS transistors MC and MD are cut off. As a consequence no charge is supplied to capacitor C1, so that the voltage across its terminals is unchanged.

When the clock signal at input 6 undergoes a transition from low level to high level, threshold comparator CO effects the comparison between the voltage at the the input of reference line and the reference voltage at input 4.

If the line voltage is higher than the reference voltage, the only signal on wire 7 passes to low level, turning on transistor MC, which supplies a certain quantity of electrical charge to capacitor C1, increasing the voltage across its terminals. A buffer amplifier BU, whose input is connected to capacitor C1, supplies a supply voltage variation, opposite to voltage variation on C1, to two inverters I1 and I2 on wire 9. Said inverters drive in turn transistors MA and MB, placed at reference driver output, with a voltage controlling the differential output resistance of transistor MA increasing its value and thus reducing the voltage present at the input of reference line L. More particularly, under these conditions a voltage equal to that present on wire 9, is rendered available to all slaved drivers DS1 ... DSn by the same number of buffer amplifiers BU1 ... BUn, whose inputs are connected to capacitor C1. Thus the decoupling is carried out between the different drivers and at the same time the high current demanded during switching phase, owing to higher operation speed, is supplied to inverters I11, I21 ..., which drive transistors MA1, MB1 ... of the other slaved drivers.

Of course if line voltage is lower than reference voltage, the circuit operation takes place so as to produce an opposite effect to that just examined on the output resistance of reference driver DM.

More particularly if line voltage is lower than the reference voltage, the only signal on wire 8 passes to low level, turning on transistor MD, which substracts a certain charge quantity from capacitor C1, reducing the voltage across its terminals. Buffer amplifier BU supplies a variation in supply voltage opposite to voltage variation on C1 to the two inverters I1 and I2, driving transistors MA and MB with a voltage controlling the output differential resistance of transistor MA by reducing its value and hence increasing the voltage present at the input of reference line L.

It is worth noting that voltage outgoing from comparator CO is maintained constant for the whole clock signal period on wire 6 and that the comparison takes place after both outputs 7 and 8 pass to high logic level. In this way the electrical charge quantity transferred to capacitor C1 is only proportional to the half-period of the clock signal on wire 6.

We claim:

1. A CMOS integrated circuit comprising:
    a plurality of fast CMOS drivers including:
        a plurality of slaved drivers having an output impedance and connected to respective transmission lines and, through the respective transmission lines, to respective receivers, and
        a dedicated mismatch correction driver having an output impedance and connected to a reference transmission line equivalent to the transmission lines connected to said slaved drivers and terminated by a resistor having a predetermined resistance;
        a threshold comparator for output impedance adjustment of said dedicated mismatch correction driver;
        means for applying a first clock signal to an input of said mismatch correction driver for producing on said reference transmission line a periodic signal;
        means for applying the periodic signal produced on said reference transmission line to said comparator;
        means for applying a reference voltage to said comparator equal to half a supply voltage of output stages of said drivers;
        means for triggering said threshold comparator with a second clock signal having a frequency equal to said first clock signal but in quadrature therewith, whereby said threshold comparator compares said periodic signal produced on said reference transmission line with said reference voltage in correspondence with transitions of said second clock signal having said frequency equal to said first clock signal but in quadrature therewith so that each comparison is carried out at a center of a half-period at which a voltage at an input of said reference transmission line is at a maximum;
        a capacitor connected to an output of said threshold comparator and charged and discharged by a comparison result from said comparator; and
        respective buffer amplifiers connected to said output stages of said drivers and having inputs connected to a receiving voltage from said capacitor, one of said buffer amplifiers controlling the output impedance of said mismatch correction driver, others of said buffer amplifiers controlling output impedance of said slaved drivers.

2. The CMOS integrated circuit defined in claim 1 wherein said clock signals have a frequency less than a bit rate of data signals applied at inputs of said slaved drivers and said clock signals have flank steepness corresponding to said data signals.

3. The CMOS integrated circuit defined in claim 1 wherein said clock signals have a frequency of about one-fourth of said bit rate.

4. The CMOS integrated circuit defined in claim 1 wherein the output voltage of said comparator is constant for an entire period of said second clock signal and comparison in said comparator is effected after outputs of said comparator pass to high levels.

* * * * *